(12) United States Patent
Morishita (10) Patent No.: US 6,954,034 B2
(45) Date of Patent: Oct. 11, 2005

(54) SEMICONDUCTOR LIGHT-EMITTING DEVICE

(75) Inventor: Yukiko Morishita, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 226 days.

(21) Appl. No.: 10/087,872

(22) Filed: Mar. 1, 2002

(65) Prior Publication Data

US 2002/0121863 A1 Sep. 5, 2002

(30) Foreign Application Priority Data

Mar. 2, 2001 (JP) .......................................... 2001-058147

(51) Int. Cl.⁷ .............................. G09G 3/10; H01S 3/04
(52) U.S. Cl. ........................ 315/169.3; 372/34; 372/36
(58) Field of Search ...................... 315/169.3; 257/627, 257/94, 68; 438/33, 29, 39, 42; 372/45, 43, 44, 46

(56) References Cited

U.S. PATENT DOCUMENTS

| 5,383,029 A | * | 1/1995 | Kojima ........................ 358/403 |
| 5,432,808 A | * | 7/1995 | Hatano et al. ................. 372/45 |
| 5,786,606 A | * | 7/1998 | Nishio et al. ................. 257/103 |
| 6,278,173 B1 | * | 8/2001 | Kobayashi et al. ........... 257/627 |
| 6,376,866 B1 | * | 4/2002 | Shakuda ...................... 257/103 |
| 6,420,197 B1 | * | 7/2002 | Ishida et al. .................. 438/22 |
| 6,452,214 B2 | * | 9/2002 | Kaneyama et al. ............ 257/79 |
| 6,455,342 B2 | * | 9/2002 | Kobayashi et al. ........... 438/33 |
| 6,469,320 B2 | * | 10/2002 | Tanabe et al. ................. 257/79 |
| 6,482,666 B1 | * | 11/2002 | Kobayashi et al. ........... 438/33 |

FOREIGN PATENT DOCUMENTS

| JP | 05-055712 | 3/1993 |
| JP | 11-145562 | 5/1999 |
| JP | 2000-058965 A | 2/2000 |

OTHER PUBLICATIONS

Cover sheet for above–referenced Japanese Laid Open No.: 2000–058965 entitled "Difference between the present application and prior art document". 1 page.

\* cited by examiner

Primary Examiner—Don Wong
Assistant Examiner—Chuc Tran
(74) Attorney, Agent, or Firm—Morrison & Foerster LLP (57) ABSTRACT

A semiconductor laser device as one example of semiconductor light-emitting devices includes a semiconductor laser chip and a submount serving respectively as a semiconductor light-emitting device chip and a mount member, the semiconductor laser chip including a GaN substrate and a stack. The semiconductor laser chip is bonded to a mount surface of the submount by means of solder, with the stack facing the mount surface. The submount includes a material having a higher thermal expansion coefficient than GaN which is a material for the GaN substrate.

17 Claims, 10 Drawing Sheets

SEMICONDUCTOR LIGHT-EMITTING DEVICE

BACKGROUND OF THE INVENTION

1. Field of the Invention

The present invention relates to semiconductor light-emitting devices. "Semiconductor light-emitting device" herein refers to a device formed by placing, on a mount member, a semiconductor light-emitting device chip such as semiconductor laser chip and LED chip and integrating the chip thereon. For example, a semiconductor light-emitting device including a semiconductor laser chip placed on a mount member is herein referred to as "semiconductor laser device."

"Mount member" herein refers to a component on which a semiconductor light-emitting device chip is directly mounted. For example, "mount member" refers to a submount used for the semiconductor light-emitting device. If the chip is mounted, without submount, directly on a supporting base, i.e., stem, frame or package, mount member refers to the stem, frame or package.

2. Description of the Background Art

GaN-based semiconductor is a material used for realizing a semiconductor light-emitting device chip for the region ranging from violet to green in the spectrum, and accordingly attracting attention. In particular, a desired semiconductor laser is the one using GaN-based semiconductor for emitting radiation of shorter wavelengths than those which have been achieved. In order to use GaN-based semiconductor in the semiconductor laser chip, sapphire which is insulator has been used as a substrate of the semiconductor laser chip. However, in recent years, a semiconductor laser chip using GaN-based semiconductor therein and being mounted on a GaN substrate instead of the sapphire substrate has also been studied, the semiconductor chip having a structure including a stack formed of an n-type semiconductor layer, an active layer, a p-type semiconductor layer and an electrode for example that are successively formed on the GaN substrate.

Here, a semiconductor laser device includes a semiconductor laser chip and a supporting base on which the chip is mounted and is capable of emitting a laser beam in a desired direction. The semiconductor laser device in operation is required to efficiently transfer and liberate heat in order to prevent deterioration of its characteristics that is caused by increase in temperature of its light-emitting component. Then, it is essential to mount the semiconductor laser chip on the supporting base so that a satisfactory thermal conductivity is achieved. According to one method for mounting the chip with a satisfactory thermal conductivity, a component called submount is provided between the supporting base and the semiconductor laser chip. The chip may be mounted "junction-down" on the submount. Specifically, the semiconductor laser chip has a substrate on one side and a stack on the other side, the stack side is opposed to the submount and the chip and the submount are coupled by die bonding. The submount is then coupled to the supporting base by die bonding for example.

Japanese Patent Laying-Open No. 2000-58965 (hereinafter "document 1") discloses an example of the semiconductor laser device employing the junction-down mounting method and an example thereof which can employ the junction-down mounting method.

Figure 8:
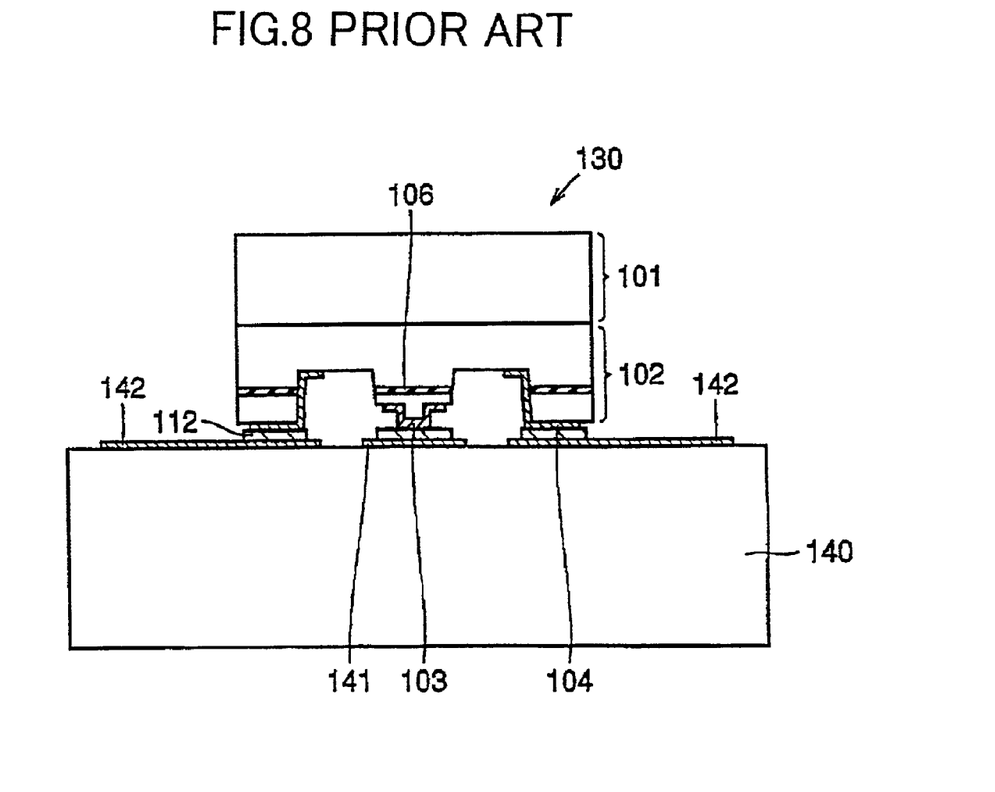
FIG. 8 shows a cross section of a conventional semiconductor laser device employing junction-down method.
Figure 9:
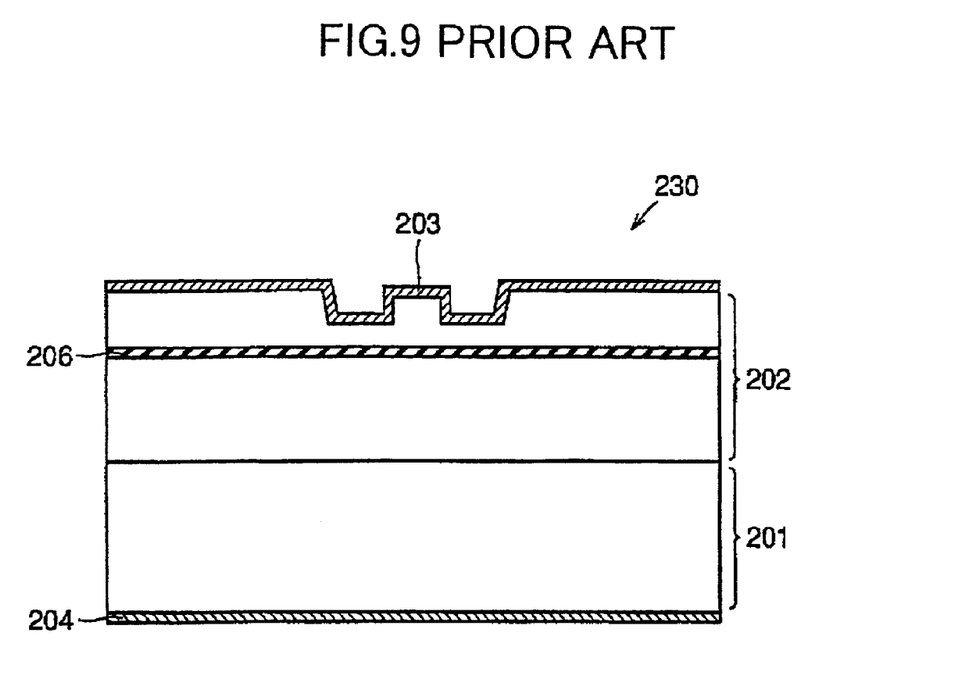
FIG. 9 shows a cross section of a conventional semiconductor laser chip.

The junction-down method is described specifically with reference to FIGS. 8 and 9 exemplarily showing conventional semiconductor laser devices to which the idea of document 1 is applied. It is noted that those components disclosed in document 1 that are not essential for the description here are simplified in the structures shown in the drawings.

FIG. 8 shows the semiconductor laser device employing the junction-down method. A semiconductor laser chip 130 includes a substrate 101 having a main surface on which a stack 102 including an active layer 106 is formed, and semiconductor laser chip 130 is mounted on a holding member 140 formed of SiC. Specifically, semiconductor laser chip 130 is mounted by being placed on holding member 140 with stack 102 opposite holding member 140, and solder 112 is used for connecting a p-type electrode 103 and an n-type electrode 104 respectively to metal films 141 and 142 on the top surface of holding member 140. SiC is used for holding member 140 since SiC is "insulator" and "excellent in thermal conductivity" as described in paragraph 0029 of document 1. Holding member 140 should serve to liberate heat and thus such a material having an excellent thermal conductivity is naturally selected. In stead of SiC, BN, AlN or diamond for example may be used as these materials are insulator and excellent in thermal conductivity as described in paragraph 0051 of document 1.

Here, semiconductor laser chip 130 is mounted on holding member 140 which may actually be regarded as a submount, as a component of the semiconductor laser device. The material for the component is selected on the same basis regardless of naming.

FIG. 9 shows a semiconductor laser chip 230 including a conductive substrate 201 formed of GaN for example having the top surface on which a stack 202 including an active layer 206 is formed. A p-type electrode 203 is formed on the top surface of stack 202 and an n-type electrode 204 is formed on the bottom surface of substrate 201. This semiconductor laser chip 230 can also be mounted "junction-down" by die bonding.

The die bonding follows a procedure as described below. Solder is applied in advance to the top surface of a submount, holding member or the like on which a semiconductor laser chip is to be mounted by die bonding. The solder is heated to at least its melting point, and the semiconductor laser chip aligned at a predetermined position is pressed against the melted solder by means of a collet. Then, the solder is cooled to solidify. In this way, the semiconductor laser chip and submount are coupled with a good thermal conductivity.

The inventors of the present invention have found that, if a semiconductor laser chip including a nitride-based compound semiconductor substrate and a nitride-based compound semiconductor which is formed on a main surface of the substrate is mounted junction-down on a submount for example, some characteristics of a resultant semiconductor light-emitting device could deteriorate. The deterioration here is increase of threshold current $I_{th}$ for lasing. Threshold current $I_{th}$ is desirably as low as possible.

Figure 10:
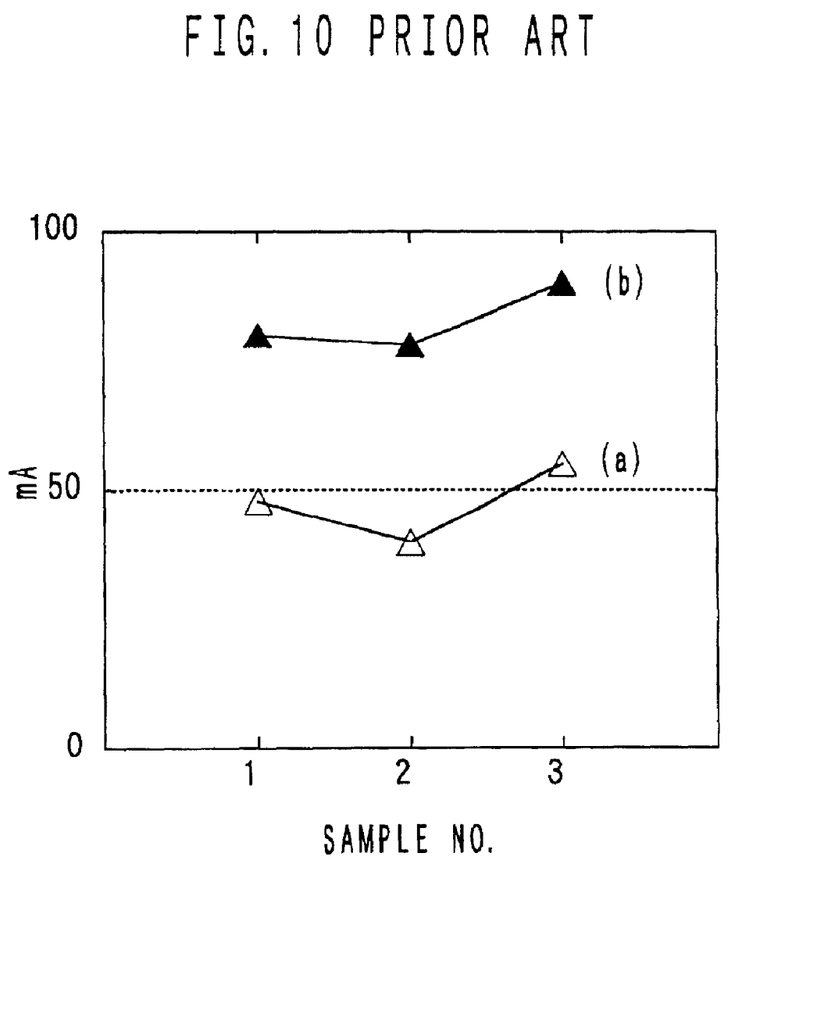
FIG. 10 is a graph showing a characteristic deterioration due to a conventional junction-down mounting method.

FIG. 10 exemplarily shows a characteristic deterioration caused by the junction-down mounting. In FIG. 10, $I_{th}$ before mounting is indicated by (a) and $I_{th}$ after mounting is indicated by (b).

SUMMARY OF THE INVENTION

One object of the present invention is thus to provide a semiconductor light-emitting device having threshold current $I_{th}$ which does not increase even if junction-down mounting is employed for the light-emitting device.

According to one aspect of the present invention, in order to achieve the above-described object, a semiconductor light-emitting device includes a semiconductor light-emitting device chip having a chip substrate and a stack formed of semiconductor layers stacked on a surface of the chip substrate, and a mount member having a mount surface. The semiconductor light-emitting device chip is connected to the mount surface of the mount member with the stack facing the mount surface, and the mount member includes a material higher in thermal expansion coefficient than a material for the chip substrate. With this structure employed, the semiconductor light-emitting device chip is bonded to the mount member and then the temperature is lowered back to room temperature. At this time, the difference in thermal expansion coefficient between the mount member and the chip substrate causes a difference in the degree of shrinkage therebetween. Consequently, the stack of the semiconductor light-emitting device chip is subjected to an increased compressive stress which decreases threshold current $I_{th}$ of the semiconductor light-emitting device.

According to another aspect of the present invention, in order to achieve the above-described object, a semiconductor light-emitting device includes a semiconductor light-emitting device chip having a chip substrate and a stack formed of semiconductor layers stacked on a surface of the chip substrate, and a mount member having a mount surface. The semiconductor light-emitting device chip is connected to the mount surface of the mount member with the stack facing the mount surface. The mount surface is curved to protrude and the semiconductor light-emitting device chip is curved along and connected to the mount surface.

With this structure employed, the semiconductor light-emitting device chip is bonded to the mount member, the chip being curved along the curved mount surface of the mount member. Consequently, the stack of the semiconductor light-emitting device chip is subjected to an increased compressive stress which decreases threshold current $I_{th}$ of the semiconductor light-emitting device.

Preferably, the chip substrate includes nitride-based compound semiconductor and the stack includes nitride-based compound semiconductor. With this structure employed, the semiconductor light-emitting device emits radiation at short wavelengths and with lower threshold current $I_{th}$ than that which has been achieved.

Preferably, the mount member includes at least one of iron and copper. Accordingly, the chip substrate including the nitride-based compound semiconductor is lower in the thermal expansion coefficient than the mount member. Further, the mount member including iron or copper provides an improved thermal conductivity.

Preferably, the mount surface and the stack are connected by solder and the solder includes at least one selected from the group consisting of In, Sn, Pb and Au. The temperature is increased in the soldering process and thereafter decreased. Then, the difference in thermal expansion coefficient increases the compressive stress. In particular, Au-based solder has a high melting point and accordingly is advantageous.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The inventors assume that, for a semiconductor laser chip of a nitride-based compound semiconductor light-emitting device, the states of stress and strain caused to a stack of the semiconductor laser chip could affect increase of threshold current $I_{th}$. Generally, the stack of the semiconductor laser chip is under compressive stress and thus compressive strain is produced therein, whether the semiconductor laser chip has a substrate of GaN or sapphire. If the chip has the sapphire substrate, compressive stress and compressive strain of the stack are caused after the stack is completed and cooled to room temperature, due to a higher thermal expansion coefficient of sapphire than that of the stack that causes the sapphire substrate to decrease in volume to a greater degree than the stack upon cooling. If the chip has the GaN substrate, compressive stress and compressive strain are caused since InGaN forming the active layer 106, 206 of the stack has a greater lattice constant than that of surrounding layers while the lattice of the active layer is forced to match that of the surrounding layers.

The inventors have conducted experiments with a plurality of samples under different conditions and taken measurements. Samples having increased threshold current $I_{th}$ are all mounted on a submount and accordingly it is assumed increased threshold current $I_{th}$ results from reduced compressive strain inherent in the stack. In other words, the stack is coupled to the submount and deformation of the stack is limited by the submount, and consequently, the stack is tensioned which reduces the compressive stress inherent in the stack thereby reduces the compressive strain.

Then, the inventors have studied change of threshold current $I_{th}$ that is caused when a compressive force is applied instead of the tensile force to the stack having inherent compression strain. Here, a GaN-based semiconductor laser chip having a GaN substrate is used.

The inventors utilize a difference in thermal expansion coefficient between GaN as a material for the substrate and a mount member, in order to apply the compressive force to the stack of the semiconductor laser chip. When the semiconductor laser chip is to be mounted junction-down on a submount which is greater in thermal expansion coefficient than GaN, the submount and semiconductor laser chip thermally expanded at high temperature are bonded together.

Then, the temperature is decreased back to room temperature. At this time, the submount decreases in volume to a greater degree than GaN. As a result, a two-dimensional compressive force is further applied to the stack of the semiconductor laser chip that further increases two-dimensional compressive stress and accordingly two-dimensional compressive strain.

The inventors also utilize the temperature for bonding the semiconductor laser chip to the submount, i.e., the melting point of solder. If solder having a higher melting point is used, the temperature for bonding is accordingly higher, which means that the submount expanded to a far greater degree is bonded. When the temperature is decreased back to room temperature, there is a greater difference in the degree of shrinkage between the GaN substrate and the submount and thus a greater compressive force is applied to the stack.

Materials known as heat-relieving materials and having higher thermal expansion coefficients than that of GaN, which has a thermal expansion coefficient of approximately $5.6 \times 10^{-6}$/k, include Ag, Cu, CuW, BeO, Fe, $Al_2O_3$ and GaAs for example. Those having smaller thermal expansion coefficients than that of GaN include Si, AlN, SiC, cBN and diamond for example. Regarding the data, see "Semiconductor Laser" by Ryoichi Itoh and Michiharu Nakamura, Baihukan, page 232, FIG. 10.19.

Solder materials having low melting points include In and alloys containing In such as InPb, InSn, InAg and InAgPb, Sn and alloys containing Sn such as SnPb, SnSb, SnAg, SnAgPb, SnAgCu and SnPbSb, and epoxy resin and polyimide mixed therein powder of Ag, Au or Cu for example. Melting points of these materials range approximately from 100° C. to 235° C. Materials having higher melting points include alloys containing Au such as AuSi, AuSn, AuGa, AuGe, AuSb, AuNi, AuIn and AuAgSn. The melting points of these materials are approximately 280° C. or higher.

First Embodiment

A semiconductor laser device according to a first embodiment of the present invention is now described with reference to FIG. 1. A semiconductor laser chip 430 includes a GaN substrate 401 and a stack 402 formed of nitride-based semiconductor on a main surface of GaN substrate 401. Stack 402 has a surface on which a p-type electrode 403 is provided. GaN substrate 401 has its rear surface on which n-type electrode 404 is provided. This semiconductor laser chip 430 thus has the double-electrode-sided structure as well as the ridge stripe structure.

Semiconductor laser chip 430 is mounted with p-type electrode 403 facing downward and toward the upper surface of a supporting base 420, and a submount 410 is provided therebetween. There is solder 412 applied between semiconductor laser chip 430 and submount 410 while there is solder 413 applied between supporting base 420 and submount 410.

Submount 410 has its front and rear surfaces on which surface electrodes 415 formed of a metal multi-layer film for metallization are provided respectively. Surface electrode 415 on the front surface of submount 410 that is connected to p-type electrode 403 is coupled by a wire 414a to supporting base 420. N-type electrode 404 is coupled by a wire 414b to a pin 411. Pin 411 is electrically connected, on the back side which is not seen in FIG. 1, to an external connection terminal (not shown) which is not a part of supporting base 420. Current is thus supplied between the external connection terminal and supporting base 420 and accordingly supplied to semiconductor laser chip 430.

Figure 2:
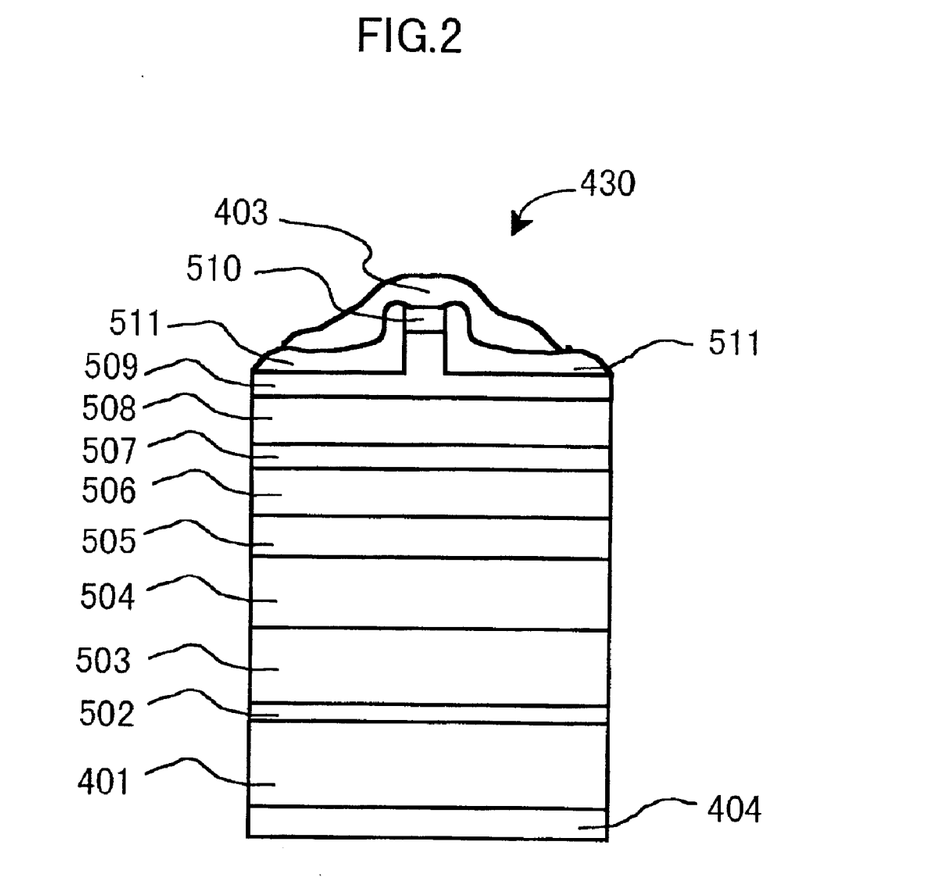
FIG. 2 shows a cross section of a semiconductor laser chip according to the first embodiment of the present invention.

Referring to FIG. 2, the structure of semiconductor laser chip 430 is described in more detail. Respective thicknesses of layers are shown with some exaggeration for convenience of description. Semiconductor laser chip 430 includes a GaN buffer layer 502, an n-GaN contact layer 503, an n-AlGaN clad layer 504, an n-GaN guide layer 505, a GaInN multi-quantum-well active layer 506, a p-AlGaN evaporation-preventing layer 507, a p-GaN guide layer 508, a p-AlGaN clad layer 509 and a p-GaN contact layer 510 that are stacked in this order on GaN substrate 401. P-AlGaN clad layer 509 and p-GaN contact layer 510 form a protrusion as shown in FIG. 2 as a ridge extending in the resonance direction of a resonator. P-type electrode 403 is formed on the upper side of the ridge. An insulating film 511 is formed between p-type electrode 403 and p-AlGaN clad layer 509 and p-GaN contact layer 510 except for the portion on the ridge.

N-type electrode 404 is formed on the lower side of GaN substrate 401.

Although semiconductor laser chip 430 is formed of the combination of materials described above, the materials are not limited to the specific ones above. Any nitride-based compound semiconductor materials may alternatively be used. Specifically, a p-AlGaInN layer may be used instead of p-AlGaN clad layer 509, and a GaInNAs layer or GaInNP layer for example may be used instead of GaInN multi-quantum-well active layer 506. In addition, multi-quantum well may be used for the clad layer. Moreover, an InGaN anti-crack layer may be provided between n-GaN contact layer 503 and n-AlGaN clad layer 504.

A method of manufacturing the semiconductor laser device is described according to this embodiment.

A process which is well-known and generally employed for manufacturing a semiconductor device is used as appropriate to produce a semiconductor laser wafer having, on GaN substrate 401, structures in great number each as shown in FIG. 2. P-type electrode 403 is made of Pd (10 nm) and Au (150 nm) arranged in this order from p-GaN contact layer 510.

GaN substrate 401 is 350 $\mu$m in thickness during crystal growth for forming the stack. Before n-type electrode 404 is formed, GaN substrate 401 is partially removed by polishing or etching performed on the rear side of GaN substrate 401 so that the wafer is reduced in thickness generally to approximately 40 to 120 $\mu$m. Then, n-type electrode 404 made of Ti (30 nm) and Al (150 nm) is formed.

End surfaces of lasers are thereafter formed through cleavage with the resonator length adjusted to 500 $\mu$m. Strip-shaped wafer divisions are generated each 500 $\mu$m in width and having a plurality of semiconductor laser chip structures successively formed. Opposing sides of each wafer division, i.e., surfaces appearing after the cleavage, are laser end-surfaces. The laser end-surfaces may be formed by etching. Then, the wafer division is divided by cleavage into semiconductor laser chips. Instead of cleavage, dicing, laser aberration or the like may be used for dividing the wafer division into semiconductor laser chips.

After this, semiconductor laser chip 430 is mounted on the supporting base by die bonding. This mounting process is described below.

On a surface of submount 410 made of Fe, an electrode pattern is formed for surface electrode 415 that is made of Au (0.1 $\mu$m)/Pt (0.1 $\mu$m)/Ti (0.1 $\mu$m) (which means "Au on Pt on Ti", this notation being similarly used in the following description). On submount 410, In solder is vapor-deposited for solder 412. The thickness of solder 412 preferably ranges from 0.5 to 20 µm and more preferably from 0.5 to 5 µm in order to prevent p-n short-circuit of the semiconductor laser chip due to the protrusion formed by the solder.

Semiconductor laser chip 430 as described above is placed on submount 410, with p-type electrode 403 facing downward. Then, submount 410 is heated to 200° C. which is slightly higher than the melting point of solder 412. The solder is thus melted and then a collet (not shown) is used to press the chip against the solder by applying an appropriate load, in order to allow semiconductor laser chip 430 and submount 410 to sufficiently adhere to solder 412. Solder 412 is thereafter solidified by cooling.

Supporting base 420 is then prepared that is made of metal mainly containing Cu or Fe and has its surface plated with an Ni/Au film. On supporting base 420, sheet-shaped PbSn solder is applied for solder 413. Submount 410 with which semiconductor laser chip 430 is joined is placed on supporting base 420 with submount 410 facing downward. Supporting base 420 is heated to a temperature which is slightly higher than the melting point of solder 413. Solder 413 is thus melted and thereafter submount 410 and supporting base 420 are sufficiently adhered to solder 413. Through cooling, solder 413 is solidified. In this way, the mounting process is completed.

Figure 1:
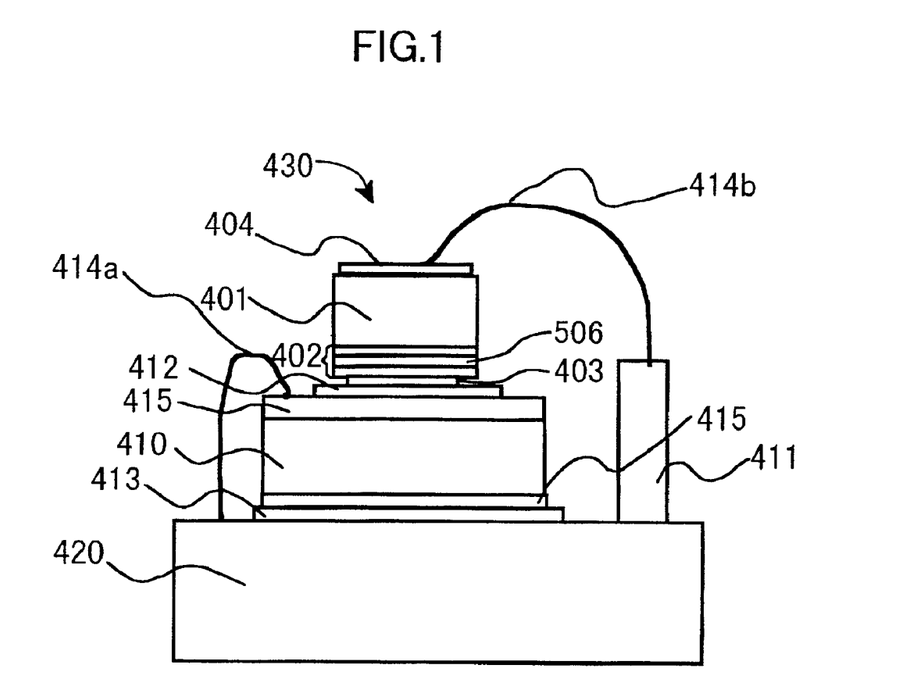
FIG. 1 shows a cross section of a semiconductor laser device according to a first embodiment of the present invention.

The semiconductor laser device as shown in FIG. 1 is thus manufactured.

Semiconductor laser chip 430 mounted on the supporting base is subjected to an increased compressive force than that applied thereto before the mounting process. This results in a greater compressive strain in stack 402 than that before the mounting. Consequently, laser threshold current $I_{th}$ decreases from 70 mA before the mounting to 65 mA after the mounting. In other words, the semiconductor laser device has improved lasing characteristics.

According to the first embodiment, submount 410 made of conductor is employed and thus submount 410 itself may serve as surface electrode 415. Further, wire 414 may be dispensed with. Moreover, not only from the surface of the submount that faces the semiconductor laser chip, direct connection to a stem, package and external lead for example is possible from the side and rear surfaces of the submount, which accordingly improves the efficiency of heat liberation and simplifies the entire system.

Instead of Fe used for submount 410 according to this embodiment, another material having a higher thermal expansion coefficient than that of GaN, for example, Ag, Cu, CuW, BeO, $Al_2O_3$ or GaAs may be used for achieving similar effects. In addition, any material having a higher thermal conductivity is preferred since such a material is superior in the heat liberation property. Here, the materials mentioned above are ordered in terms of the thermal conductivity: Ag>Cu>Au>BeO>CuW>Fe>GaAs>$Al_2O_3$.

Instead of In solder used for solder 412 which joins semiconductor laser chip 430 with submount 410 according to this embodiment, another solder having a low melting point may be used, for example, In-based solder such as InPb, InSn, InAg and InAgPb, Sn-based solder such as Sn, SnPb, SnSb, SnAg, SnAgPb, SnAgCu and SnPbSb, Pb-based solder such as PbSb, PbAg and PbZn, or epoxy resin or polyimide in which powder of Ag, Au or Cu for example is mixed, in order to achieve similar effects. In addition, instead of vapor deposition used for forming solder 412 according to this embodiment, application, sputtering, printing or plating for example may be used. Such solder as In-based solder which is relatively soft allows semiconductor chip 430, which slightly warps before the mounting process, not to readily separate from the submount after the mounting process, and consequently enhances the reliability of the semiconductor laser device.

According to this embodiment, PbSn solder is used as solder 413 for bonding submount 410 to supporting base 420. Solder 413 may be of any material, for example, In-based solder, Sn-based solder, Au-based solder or Pb-based solder. Solder 413 is preferably lower in the melting point than solder 412 in order to avoid adverse influences on solder 412 which is formed between semiconductor laser chip 430 and submount 410 before solder 413 is formed. Instead of using sheet-shaped solder 413 as described above, the solder may be provided by vapor deposition, application, sputtering, printing or plating for example.

According to this embodiment, Pd/Au is used for p-type electrode 403. Instead of Pd, any of Co, Cu, Ag, Ir, Sc, Au, Cr, Mo, La, W, Al, Tl, Y, La, Ce, Pr, Nd, Sm, Eu, Tb, Ti, Zr, Hf, V, Nb, Ta, Pt and Ni, or a compound of any of these may be used. Instead of Au, any of Ni, Ag, Ga, In, Sn, Pb, Sb, Zn, Si, Ge and Al, or a compound of any of these may be used. In addition, the film thickness is not limited to the above-specified one.

According to this embodiment, Ti/Al is used for n-type electrode 404. Instead of Ti, any of Co, Cu, Ag, Ir, Sc, Au, Cr, Mo, La, W, Al, Tl, Y, La, Ce, Pr, Nd, Sm, Eu, Tb, Zr, Hf, V, Nb, Ta, Pt, Ni and Pd, or a compound of any of these may be used. Instead of Al, any of Au, Ni, Ag, Ga, In, Sn, Pb, Sb, Zn, Si and Ge, or a compound of any of these may be used. In addition, the film thickness is not limited to the above-specified one.

Figure 5:
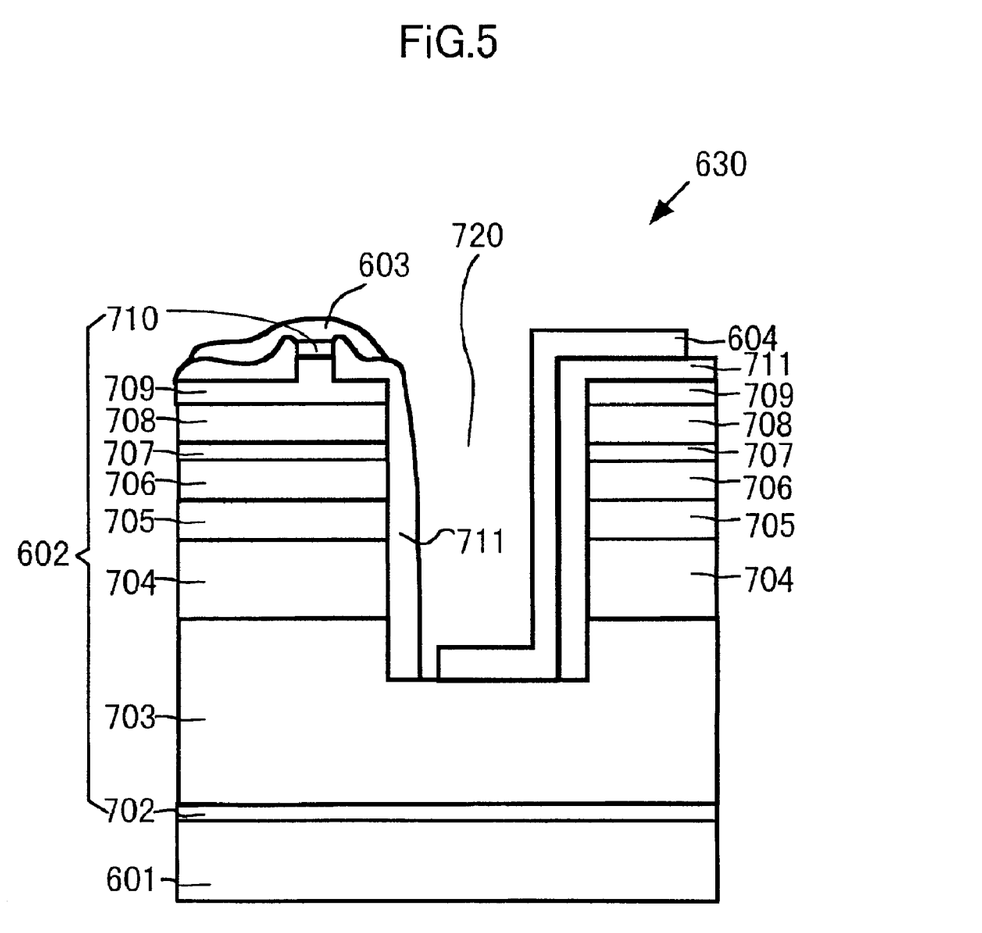
FIG. 5 shows a cross section of a semiconductor laser chip according to the third embodiment of the present invention.

According to this embodiment, semiconductor laser chip 430 has the double-electrode-sided structure as shown in FIG. 2. However, the present invention is applicable to a single-electrode-sided semiconductor laser chip 630 as shown in FIG. 5 for example, on the condition that the semiconductor laser chip has a stack to which a compressive stress is exerted before the chip is mounted. In this case, similar effects are achieved. It is noted that, for the single-electrode-sided semiconductor laser chip, an electrode pattern of a submount that faces the electrode of the semiconductor laser chip should be placed to avoid short-circuit of positive and negative electrodes.

Second Embodiment

A second embodiment according to the present invention is described. According to the second embodiment, the combination of materials for the submount and solder which bonds the semiconductor laser chip to the submount is changed, for the structure of the first embodiment described above, in order to find out more preferable conditions for decreasing threshold current $I_{th}$. Respective threshold currents before and after the mounting process are compared to determine the extent to which the threshold current decreases.

Figure 3:
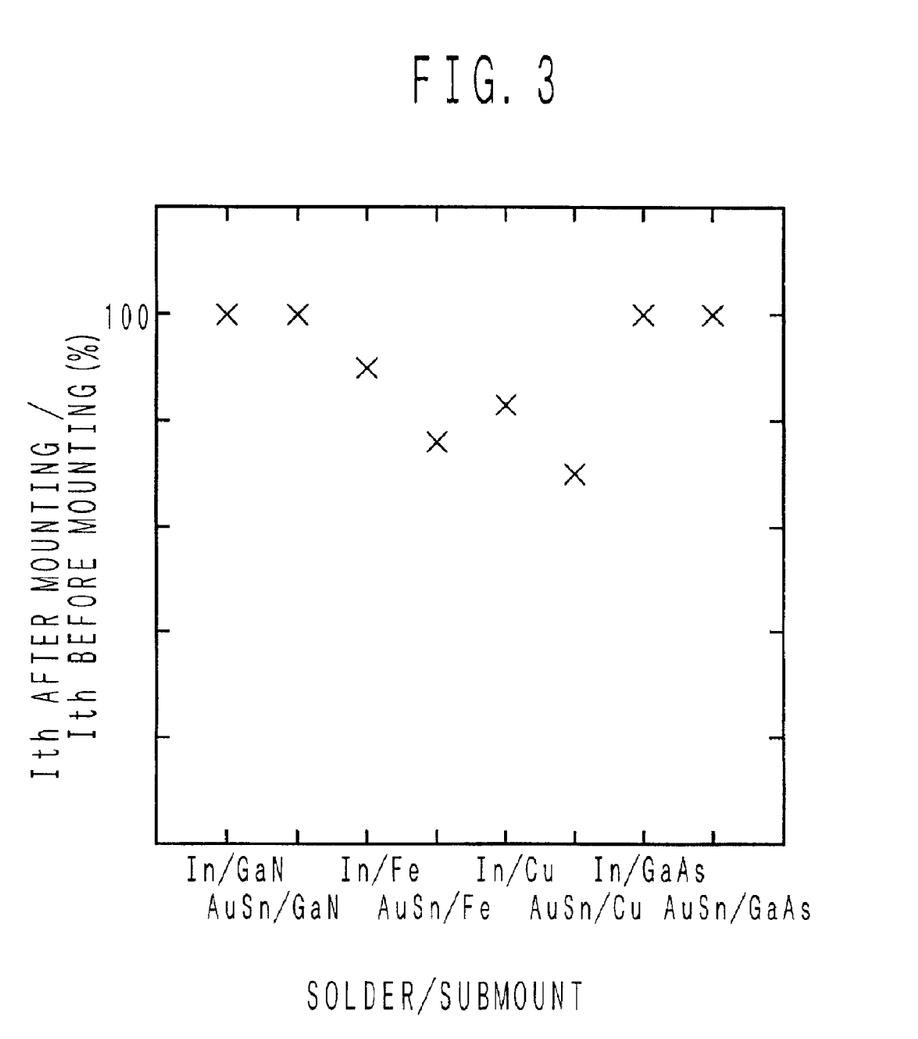
FIG. 3 is a graph showing experimental results according to a second embodiment of the present invention.

FIG. 3 shows experimental results. For a submount of Fe or Cu, threshold current $I_{th}$ decreases to appropriately 70 to 90% of the threshold current before the mounting process. Further, AuSn solder having a melting point of 280° C. provides a greater degree of decrease in threshold current $I_{th}$ than that provided by In solder having a melting point of 157° C. For submounts of GaN and GaAs, threshold current $I_{th}$ does not decrease.

Third Embodiment

Figure 4:
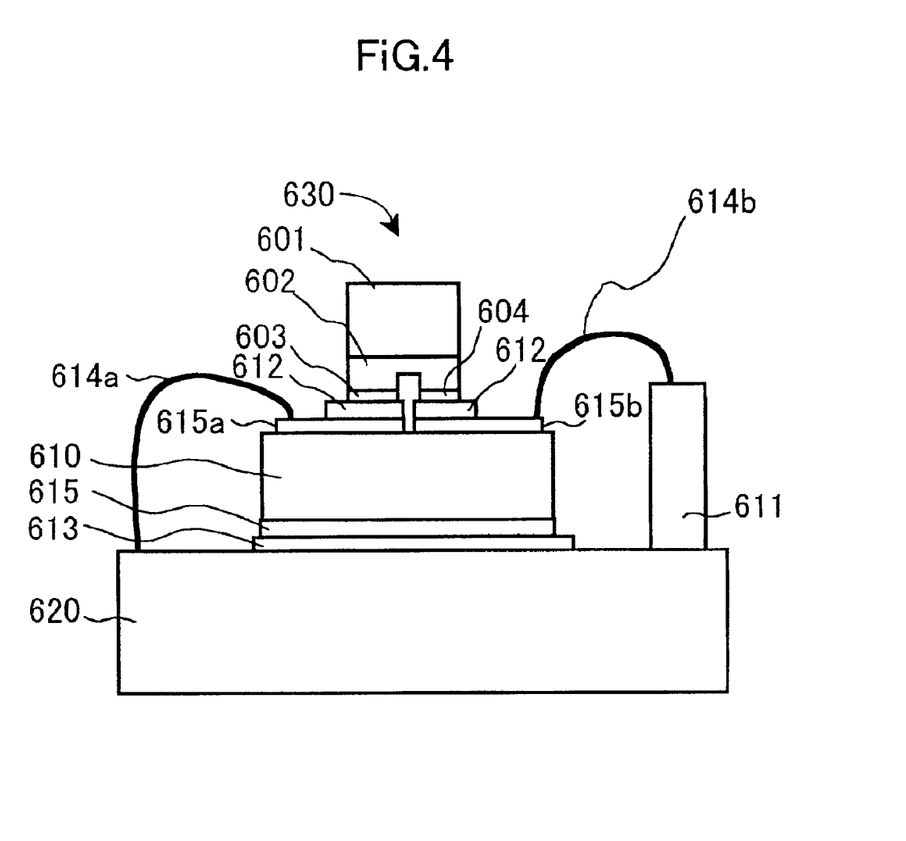
FIG. 4 shows a cross section of a semiconductor laser device according to a third embodiment of the present invention.

Referring to FIG. 4, a semiconductor laser device according to a third embodiment of the present invention is described. According to the third embodiment, a semiconductor laser chip 630 is used, and solder and submount materials more appropriate than those of the first embodiment are used for enhancing the effects achieved by the first embodiment. Semiconductor laser chip 630 includes a GaN substrate 601 having its main surface on which a stack 602 of nitride-based semiconductor is formed. Stack 602 has its surface on which provided p-type electrode 603 and an n-type electrode 604. In other words, semiconductor laser chip 630 has single-electrode-sided structure.

The difference between the first and third embodiments, that is, one is the double-electrode-sided structure and the other is the single-electrode-sided structure, has no significant influence on the degree of decrease in threshold current $I_{th}$.

Semiconductor laser chip 630 is placed on a supporting base 620 with p-type electrode 603 facing downward and a submount 610 provided therebetween. Solder 612 is provided between semiconductor laser chip 630 and submount 610 while solder 613 is provided between supporting base 620 and submount 610.

Submount 610 has its surface on which surface electrodes 615a and 615b formed of a metal multi-layer film for metallization are provided. Surface electrode 615a on the front surface of submount 610 that is connected to p-type electrode 603 is coupled by a wire 614a to supporting base 620. Surface electrode 615b on the front surface of submount 610 that is connected to n-type electrode 604 is coupled by a wire 614b to a pin 611. Pin 611 is electrically connected, on the back side which is not seen in FIG. 4, to an external connection terminal (not shown) which is not a part of supporting base 620. Current is thus supplied between the external connection terminal and supporting base 620 and accordingly supplied to semiconductor laser chip 630.

Referring to FIG. 5, the structure of semiconductor laser chip 630 is described in more detail. Respective thicknesses of layers are shown with some exaggeration for convenience of description. Semiconductor laser chip 630 includes a GaN buffer layer 702, an n-GaN contact layer 703, an n-AlGaN clad layer 704, an n-GaN guide layer 705, a GaInN multi-quantum-well active layer 706, a p-AlGaN evaporation-preventing layer 707, a p-GaN guide layer 708 and p-AlGaN clad layer 709 that are stacked in this order on GaN substrate 601. A trench 720 is formed by partially removing the stack from the upper surface thereof. Trench 720 extends from p-AlGaN clad layer 709 into n-GaN contact layer 703. An insulating film 711 formed on p-AlGaN clad layer 709 as well as n-type electrode 604 extend into trench 720 and n-type electrode 604 accordingly contacts n-GaN contact layer 703. Insulating film 711 is formed to insulate the stack from n-AlGaN clad layer 704 to p-AlGaN clad layer 709 from n-type electrode 604 except for the contact between n-type electrode 604 within trench and n-GaN contact layer 703. P-AlGaN clad layer 709 is shown to be divided into two regions with trench 720 therebetween, and one of the regions has a ridge shown as a protrusion in FIG. 5 extending in the resonance direction of a resonator. The ridge has its end on which a p-GaN contact layer 710 is formed. P-type electrode 603 is formed on p-AlGaN clad layer 709 including the ridge and p-GaN contact layer 710. Insulating film 711 is formed between p-type electrode 603 and p-AlGaN clad layer 709 and p-GaN contact layer 710 except for the portion on the ridge.

According to this embodiment, semiconductor laser chip 630 is formed of the above-described combination of materials. However, other nitride-based compound semiconductor materials may be used instead of the above-described ones. Specifically, a p-AlGaInN layer may be used instead of p-AlGaN clad layer 709, and GaInNAs layer or GaInNP layer may be used instead of GaInN multi-quantum-well active layer 706. In addition, multi-quantum-well may be used as the clad layer. Further, an InGaN anti-crack layer may be provided between n-GaN contact layer 703 and n-AlGaN clad layer 704.

A method of manufacturing the semiconductor laser device according to this embodiment is described.

A process which is well-known and generally employed for manufacturing a semiconductor device is used as appropriate to produce a semiconductor laser wafer having, on GaN substrate 601, structures in great number each as shown in FIG. 5. P-type electrode 603 is made of Ni (10 nm) and Au (200 nm), Ni being closer to p-GaN contact layer 710 relative to Au. N-type electrode 604 is made of Hf (30 nm), Al (150 nm), Mo (30 nm) and Au (150 nm), Hf being closest to n-GaN contact layer 703 relative to other components.

GaN substrate 601 is 350 μm in thickness during crystal growth for forming the stack. GaN substrate 601 is partially removed by polishing or etching performed on the rear side of GaN substrate 601 so that the wafer is reduced in thickness generally to approximately 40 to 120 μm.

End surfaces of lasers are thereafter formed through cleavage with the resonator length adjusted to 500 μm. Strip-shaped wafer divisions are generated each 500 μm in width and having a plurality of semiconductor laser chip structures successively formed. Opposing sides of each wafer division, i.e., surfaces appearing after the cleavage, are laser end-surfaces. The laser end-surfaces may be formed by etching. Then, the wafer division is divided by cleavage into semiconductor laser chips. Instead of cleavage, dicing, laser aberration or the like may be used for dividing the wafer division into semiconductor laser chips.

After this, semiconductor laser chip 630 is mounted on the supporting base by die bonding. This mounting process is described below.

On the surface of submount 610 made of Cu, an electrode pattern is formed for surface electrodes 615a and 615b that is made of Au (0.1 μm)/Pt (0.1 μm)/Ti (0.1 μm). On submount 610, AuSn solder is vapor-deposited for solder 612. The thickness of solder 612 preferably ranges from 0.5 to 20 μm and more preferably from 0.5 to 5 μm in order to prevent p-n short-circuit of the semiconductor laser chip due to the protrusion formed by the solder.

Semiconductor laser chip 630 as described above is placed on submount 610, with the electrodes facing downward. Then, submount 610 is heated to 370° C. which is slightly higher than the melting point of solder 612. The solder is thus melted and then a collet (not shown) is used to press the chip against the solder by applying an appropriate load, in order to allow semiconductor laser chip 630 and submount 610 to sufficiently adhere to solder 612. Solder 612 is thereafter solidified by cooling.

Supporting base 620 is then prepared that is made of metal mainly containing Cu or Fe and has its surface plated with an Ni/Au film. On supporting base 620, sheet-shaped PbSn solder is applied for solder 613. Submount 610 with which semiconductor laser chip 630 is joined is placed on supporting base 620 with submount 610 facing downward. Supporting base 620 is heated to a temperature which is slightly higher than the melting point of solder 613. Solder 613 is thus melted and thereafter submount 610 and supporting base 620 are sufficiently adhered to solder 613. Through cooling, solder 613 is solidified. In this way, the mounting process is completed.

The semiconductor laser device as shown in FIG. 4 is thus manufactured.

To semiconductor laser chip 630 mounted on the supporting base, an increased compressive force is applied than that applied thereto before the mounting process. This results in a greater compressive strain in stack 602 than that before the mounting. In addition, the compressive strain in the stack is greater compared with the compressive strain produced in the stack of the first embodiment after the bonding of the stack to the submount. This is because AuSn solder used as solder 612 is higher in the melting point than In solder of the first embodiment. Further, as Cu of the submount of this embodiment has a higher thermal conductivity than Fe of the first embodiment, the efficiency of heat liberation is enhanced.

Consequently, lasing threshold current $I_{th}$ decreases from 70 mA before the mounting process to 50 mA after the mounting process. This means that the semiconductor laser device is further improved in terms of its characteristics compared with the first embodiment.

Instead of Cu of submount 610 according to this embodiment, another material having a higher thermal expansion coefficient than that of GaN may be used to achieve similar effects. Specific materials are described above in connection with the material of submount 410 of the first embodiment.

Instead of AuSn solder as solder 612 for bonding semiconductor laser chip 630 to submount 610, another Au-based solder having a high melting point such as AuSi, AuGa, AuGe, AuSb and AuNi may be used to achieve similar effects. Instead of vapor deposition for forming solder 612 of this embodiment, application, sputtering, printing or plating for example may be used for forming the solder. Alternatively, sheet-shaped solder may be provided on submount 610.

Solder 613 may be of any material, for example, In-based solder, Sn-based solder, Au-based solder or Pb-based solder. Solder 613 is preferably lower in the melting point than solder 612 in order to avoid adverse influences on solder 612 which is formed between semiconductor laser chip 630 and submount 610 before solder 613 is formed. Instead of using the sheet-shaped solder as described above, solder 613 may be provided by vapor deposition, application, sputtering, printing or plating for example.

Instead of the materials and thickness of p-type electrode 603 specified above, those of the first embodiment may be used.

According to this embodiment, Hf/Al/Mo/Au is used for n-type electrode 604. Instead of Hf, any of Co, Cu, Ag, Ir, Sc, Au, Cr, Mo, La, W, Al, Tl, Y, La, Ce, Pr, Nd, Sm, Eu, Tb, Zr, Ti, V, Nb, Ta, Pt, Ni and Pd, or a compound of any of these may be used. Instead of Al, any of Au, Ni, Ag, Ga, In, Sn, Pb, Sb, Zn, Si and Ge, or a compound of any of these may be used. Instead of Mo, any of Ti, Zr, Cr, W, Fe, Zn, Cd, Al, Ni, Pd, Pt and Cu, or a compound of any of these may be used. Instead of Au, any of Ni, Ag, Ga, In, Sn, Pb, Sb, Zn, Si, Ge and Al, or a compound of any of these may be used. In addition, the film thickness is not limited to the above-specified one.

According to this embodiment, semiconductor laser chip 630 has the single-electrode-sided structure as shown in FIG. 5. However, the present invention is applicable to the double-electrode-sided semiconductor laser chip 430 as shown in FIG. 2 for example, on the condition that the semiconductor laser chip has a stack to which a compressive stress is exerted before the chip is mounted. In this case, similar effects are achieved.

Fourth Embodiment

The inventors have found another method of applying a compressive force to the stack of the semiconductor laser chip, instead of the method utilizing the difference in the thermal expansion coefficient. Specifically, the semiconductor laser chip is curved for applying a compressive force.

Figure 6:
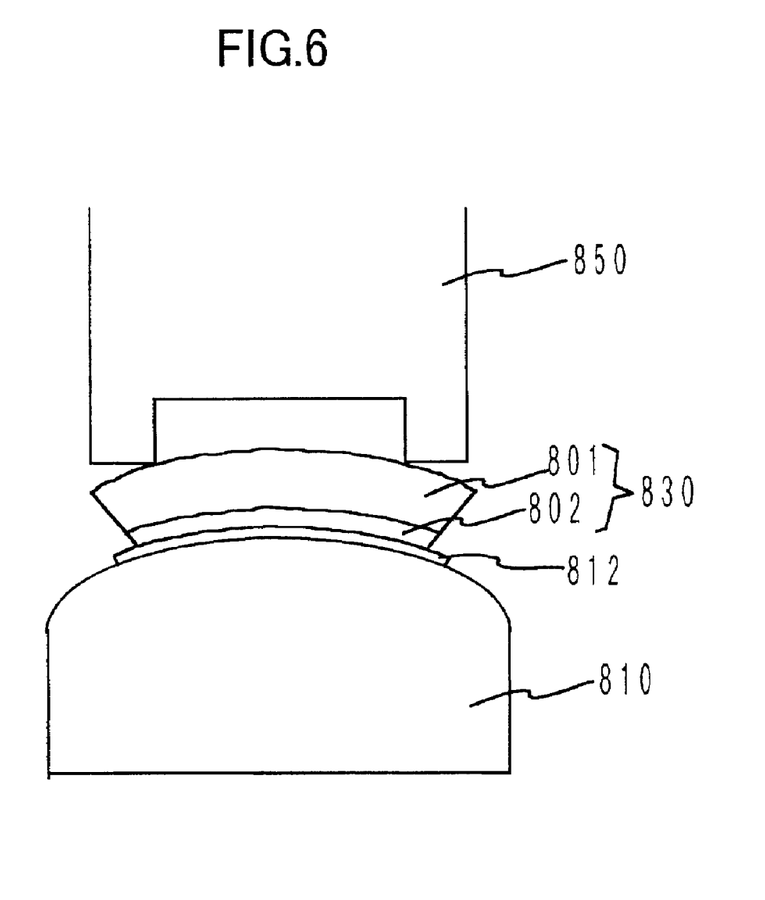
FIG. 6 illustrates a mounting process for a semiconductor laser device according to a fourth embodiment of the present invention.

According to a fourth embodiment of the present invention, referring to FIG. 6, a compressive force is applied to a stack of a semiconductor laser chip by curving the semiconductor laser chip.

This semiconductor laser chip 830 is mounted on an upwardly curved and thus protruded surface of a submount 810. A collet 850 is used for pressing semiconductor laser chip 830 against submount 810. Collet 850 is shaped as shown in FIG. 6 having projecting ends opposite each other with the recessed central portion therebetween, in order to be adapted to the curve of submount 810. The semiconductor laser device is similar to that of the first or third embodiment except for the details described here.

As shown in FIG. 6, semiconductor laser chip 830 similar to semiconductor laser chip 630 shown in FIG. 5 of the third embodiment is mounted junction-down on submount 810 by die bonding like that of the third embodiment, with AuSn solder 812 therebetween. Submount 810 is made of Cu having its surface on which an electrode pattern is formed and the upper surface thereof is upwardly curved and thus protruded. Regarding the die bonding, only the shape of the collet differs from that of the third embodiment.

A compressive force applied to semiconductor laser chip 830 having been mounted on the submount is greater than that before the chip is mounted thereon. In other words, the mounting process adds a one-dimensional compressive stress due to the deformation (curve) of the chip to the two-dimensional compressive stress. Consequently, in a stack 802, greater two-dimensional strain and one-dimensional strain are produced as compared to the state before the mounting. Accordingly, lasing threshold current $I_{th}$ decreases from 70 mA before the mounting process to 35 mA after the mounting process. Thus, the semiconductor laser chip has remarkably improved characteristics.

According to this embodiment, the degree of compressive strain may be adjusted by means of the radius of curvature of the curved surface of submount 810. The radius of curvature may be decreased on the condition that semiconductor laser chip 830 is not broken in order to increase the compressive strain and thus increase the extent to which threshold current $I_{th}$ decreases.

This embodiment is applicable not only to the form described above but also to all of the first to the third embodiments. In other words, the semiconductor laser chip here may have any of the double-electrode-sided structure and single-electrode-sided structure. The material for the submount preferably has a higher thermal expansion coefficient than that of the GaN substrate as described in connection with the first and third embodiments, since the compressive strain is increased not only by the curve but also the difference in the thermal expansion coefficient. However, some effects would be achieved even if the thermal expansion coefficient of the submount is lower than that of the GaN substrate. Further, any material having a higher thermal conductivity is preferably employed since such a material provides a superior heat liberation property as described for the first embodiment. In other words, the higher thermal expansion coefficient of the submount than that of GaN as described for the first embodiment, the higher melting point of solder as described for the third embodiment, and the curved upper surface of the submount as described for this embodiment may appropriately be combined so as to produce a greater compressive strain in the stack, and thus such a combination is preferable.

Figure 7:
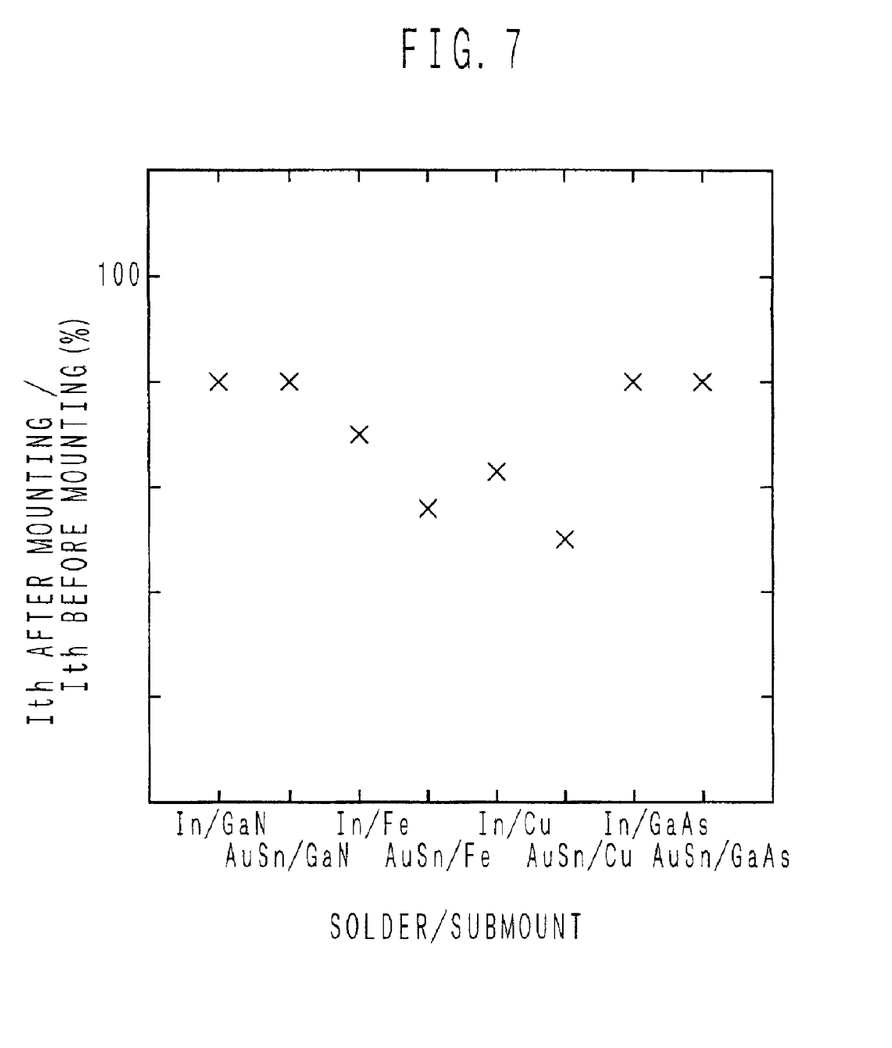
FIG. 7 is a graph showing experimental results according to the fourth embodiment of the present invention.

The submount of this embodiment having the curved upper surface is used and the combination of respective materials for the submount and solder, which bonds the semiconductor laser chip to the submount, is changed to compare resultant degrees to which threshold current $I_{th}$ decreases from the one before mounting to the one after mounting, which is shown in FIG. 7. Measurements shown in FIG. 7 indicate that the effect of decreasing threshold current $I_{th}$ is further enhanced as compared with FIG. 3 according to which the effect is achieved by means of materials for the solder and submount.

Some embodiments of the present invention are heretofore described. The applicable range of the present invention is not limited to the one discussed above. Components may be replaced with respective components used for the same purpose, and another technique may be combined with the one descried above.

The above-described semiconductor laser chip is not limited to specific ones shown in FIGS. 2 and 5. The substrate may be made of another nitride-based compound semiconductor material, for example. The semiconductor growth layers may be made of other materials such as AlGaInN-based, GaInNAs-based, GaInNP-based, InGaAsP-based, InGaAlP-based, AlGaN-based, and CdZnSe-based materials. Moreover, instead of the semiconductor laser chip, another light-emitting device chip such as chips for LED and super-luminescence diode may be used. In any case, the essential concern is the degree of compressive strain or compressive stress produced in the light-emitting device chip after being mounted.

On the chip-mounted surface of the submount, pads for wire bonding as well as any alignment mark may be provided for die bonding as readily conceived by those having ordinary skill in the art. The present invention is further applicable to a semiconductor laser device including a semiconductor laser chip having at least three electrodes like so-called multi-beam laser.

It is well-known to provide various layers between the solder layer and submount. For example, a film for improving adhesion between the submount and solder or a film for preventing reaction between the submount and solder may be provided between the submount and solder, or these films may appropriately be stacked. Instead of the metal pattern Au/Pt/Ti mentioned above, Pt/Cr, Au/MoAu/Pt/Cr or Au/Mo/Ti for example may be employed. Moreover, various films may be provided between the solder, bonding pads and submount for the purposes as descirbed above.

Although the description of the embodiments above is applied to the submount serving as a mount member, the present invention is applicable to general mount members for light-emitting device chips. In other words, if a light-emitting device chip and a mount member have respective thermal expansion coefficients having the relation as described for the embodiments above, similar effects to those of the embodiments are accomplished. For example, if the light-emitting device chip is mounted directly on a stem, frame or package without submount, the stem, frame or package may be regarded as the mount member to which the present invention may be applied.

According to the present invention, the semiconductor light-emitting device chip is bonded to the mount member that have respective thermal expansion coefficients different from each other, and the chip and mount member accordingly differ from each other in the degree of shrinkage when the temperature is decreased back to room temperature. Consequently, an increased compressive stress is applied to the stack of the semiconductor light-emitting device chip, and thus threshold current $I_{th}$ of the semiconductor device light-emitting decreases.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor light-emitting device comprising:
    a semiconductor light-emitting device chip including a chip substrate and a stack formed of semiconductor layers stacked on a surface of said chip substrate; and
    a mount member having a mount surface, wherein
    said semiconductor light-emitting device chip is connected to the mount surface of said mount member by solder between the semiconductor light-emitting device chip and said mount surface of said mount member, with said stack facing said mount surface,
    said mount member includes a material higher in thermal expansion coefficient than a material for said chip substrate,
    said chip substrate includes nitride-based compound semiconductor, and
    said stack includes nitride-based compound semiconductor.

2. A semiconductor light-emitting device comprising:
    a semiconductor light-emitting device chip including a chip substrate and a stack formed of semiconductor layers stacked on a surface of said chip substrate; and
    a mount member having a mount surface, wherein
    said semiconductor light-emitting device chip is connected to the mount surface of said mount member by solder between the semiconductor light-emitting device chip and said mount surface of said mount member, with said stack facing said mount surface,
    said mount surface is curved to protrude and said semiconductor light-emitting device chip is curved along and connected to said mount surface, and
    said stack includes nitride-based compound semiconductor.

3. The semiconductor light-emitting device according to claim 1, wherein
    said mount member includes at least one of iron and copper.

4. The semiconductor light-emitting device according to claim 1, wherein
    said mount surface and said stack are connected by solder and said solder includes at least one selected from the group consisting of In, Sn, Pb, and Au.

5. The semiconductor light-emitting device according to claim 4, wherein
    said mount member includes at least one of iron and copper.

6. The semiconductor light-emitting device according to claim 2, wherein
    said chip substrate includes nitride-based compound semiconductor.

7. The semiconductor light-emitting device according to claim 6, wherein said mount member includes at least one of iron and copper.

8. A semiconductor light-emitting device comprising:

a semiconductor light-emitting device chip including a chip substrate and a stack formed of semiconductor layers stacked on a surface of said chip substrate; and a mount member having a mount surface, where said semiconductor light-emitting device chip is connected to the mount surface of said mount member by solder between the semiconductor light-emitting device chip and said mount surface of said mount member, with said stack facing said mount surface, said mount member includes a material higher in thermal expansion coefficient than a material for said chip substrate;

said stack is formed by stacking the semiconductor layers on the surface of said chip substrate in advance of connecting said semiconductor light-emitting device chip to the mount surface of said mount member, said chip substrate includes nitride-based compound semiconductor, and said stack includes nitride-based compound semiconductor.

9. The semiconductor light-emitting device according to claim 8, wherein said mount member includes at least one of iron and copper.

10. A semiconductor light-emitting device comprising:

a semiconductor light-emitting device chip including a chip substrate and a stack formed of semiconductor layers stacked on a surface of said chip substrate; and a mount member having a mount surface, wherein said semiconductor light-emitting device chip is connected to the mount surface of said mount member by solder between the semiconductor light-emitting device chip and said mount surface of said mount member, with said stack facing said mount surface, said mount surface is curved to protrude and said semiconductor light-emitting device chip is curved along and connected to said mount surface, said stack is formed by stacking the semiconductor layers on the surface of said chip substrate in advance of connecting said semiconductor light-emitting device chip to the mount surface of said mount member, and said stack includes nitride-based compound semiconductor.

11. The semiconductor light-emitting device according to claim 10, wherein said chip substrate includes nitride-based compound semiconductor.

12. The semiconductor light-emitting device according to claim 11, wherein said mount member includes at least one of iron and copper.

13. A semiconductor light-emitting device comprising:

a semiconductor light-emitting device chip including a chip substrate and a stack formed of semiconductor layers stacked on a surface of said chip substrate; and a mount member having a mount surface, wherein said semiconductor light-emitting device chip is connected to the mount surface of said mount member with said stack facing said mount surface, said mount member includes a material higher in thermal expansion coefficient than a material for said chip substrate, wherein said mount surface and said stack are connected by solder and said solder includes at least one selected from the group consisting of In, Sn, Pb and Au, said chip substrate includes nitride-based compound semiconductor, and said stack includes nitride-based compound semiconductor.

14. The semiconductor light-emitting device according to claim 13, wherein said mount member includes at least one of iron and copper.

15. The semiconductor light-emitting device according to claim 1, wherein an electrode is provided on said chip substrate.

16. The semiconductor light-emitting device according to claim 8, wherein an electrode is provided on said chip substrate.

17. The semiconductor light-emitting device according to claim 13, wherein an electrode is provided on said chip substrate.

* * * * *